United States Patent
Zhu et al.

(10) Patent No.: US 12,538,738 B2
(45) Date of Patent: Jan. 27, 2026

(54) SEMICONDUCTOR PROCESS MACHINE AND OPERATION METHOD THEREOF

(71) Applicant: United Semiconductor (Xiamen) Co., Ltd., Fujian (CN)

(72) Inventors: Haipeng Zhu, Fujian (CN); Xijun Guo, Singapore (SG); Min-Hsien Chen, Taichung (TW); Kuo Liang Huang, Singapore (SG); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 223 days.

(21) Appl. No.: 18/131,860

(22) Filed: Apr. 6, 2023

(65) Prior Publication Data
US 2024/0297056 A1    Sep. 5, 2024

(30) Foreign Application Priority Data
Mar. 1, 2023 (CN) .......................... 202310185213.5

(51) Int. Cl.
*H01L 21/67* (2006.01)
(52) U.S. Cl.
CPC .. *H01L 21/67201* (2013.01); *H01L 21/67126* (2013.01)

(58) Field of Classification Search
CPC ......... H01L 21/67201; H01L 21/67126; H01L 21/67017; H01L 21/67196
See application file for complete search history.

(56) References Cited

U.S. PATENT DOCUMENTS

| | | | | |
|---|---|---|---|---|
| 3,848,638 | A  * | 11/1974 | Huslander | F16L 55/172 24/279 |
| 6,186,722 | B1 * | 2/2001 | Shirai | H01L 21/67167 414/217 |
| 2017/0025290 | A1 * | 1/2017 | Wakabayashi | H01L 21/67772 |
| 2020/0335332 | A1 * | 10/2020 | Sun | H01L 21/67766 |
| 2021/0013061 | A1 * | 1/2021 | Baggett | H01J 37/3171 |
| 2021/0043480 | A1 * | 2/2021 | Motegi | H01L 21/67109 |
| 2021/0259087 | A1 * | 8/2021 | Ramachandran | H01L 21/67201 |
| 2022/0336239 | A1 * | 10/2022 | Choi | H01L 21/67201 |

FOREIGN PATENT DOCUMENTS

JP         11029869 A  *  2/1999

* cited by examiner

*Primary Examiner* — Glenn F Myers
(74) *Attorney, Agent, or Firm* — Winston Hsu

(57) ABSTRACT

The invention provides a semiconductor processing machine, which comprises a plurality of chambers, at least one of the chamber is a load-lock chamber, and the load-lock chamber comprises a bottom surface and a top lid opposite to the bottom surface; and a gas pipeline is connected with the top lid of the load-lock chamber.

18 Claims, 3 Drawing Sheets

SEMICONDUCTOR PROCESS MACHINE AND OPERATION METHOD THEREOF

BACKGROUND OF THE INVENTION

1. Field of the Invention

The present invention relates to a semiconductor processing machine and its operation method, in particular to an improved connection structure between a load-lock chamber and a gas pipeline.

2. Description of the Prior Art

The vacuum load-lock vapor sputtering system is divided into a load-lock chamber and a coating chamber. The object to be coated can be placed in the load-lock chamber and transported to the coating chamber, and then taken out of the load-lock chamber after the process is completed. This system can maintain the cleanliness of the coating chamber, improve the coating quality and shorten the process time.

At present, the vacuum load-lock vapor sputtering system still has some technical problems, such as the long time spent in transferring wafers between chambers, or some deposited particles in the chambers, which will affect the quality of wafers when floating in the air. The above problems still need to be improved.

SUMMARY OF THE INVENTION

The invention provides a semiconductor processing machine, which comprises a plurality of chambers, wherein at least one of the chambers is a load-lock chamber, and the load-lock chamber comprises a bottom surface and a top lid opposite to the bottom surface, and a gas pipeline is connected with the top lid of the load-lock chamber.

The invention also provides an operation method of a semiconductor processing machine, which comprises the following steps: providing a plurality of chambers, wherein at least one of the chambers is a load-lock chamber, the load-lock chamber comprises a bottom surface and a top lid opposite to the bottom surface, providing a gas pipeline to connect the top lid of the load-lock chamber, performing a vacuum breaking step on the load-lock chamber, and transferring a wafer located in the load-lock chamber to another chamber.

The invention provides an improved semiconductor machine and an operation method thereof. In particular to an improved connection structure of a load-lock chamber and a gas pipeline. The main difference is that the joint of the pipeline is moved from the load-lock chamber body to the top lid of the load-lock chamber, elements such as filters and pressure regulating valves are added, and the gaskets are unified to the same size. According to the applicant's experimental results, after improving the connection structure between the load-lock chamber and the pipeline in the above way, the time of each vacuum breaking step can be reduced from 50 seconds to about 22 seconds, thus greatly improving the process speed. In the current process of semiconductor machine, the number of wafers produced per hour can be increased from 45 pieces to about 75 pieces, which improves the process efficiency by about 166%. In addition, because the size of the gasket is unified, the probability of error caused by manual assembly can be reduced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
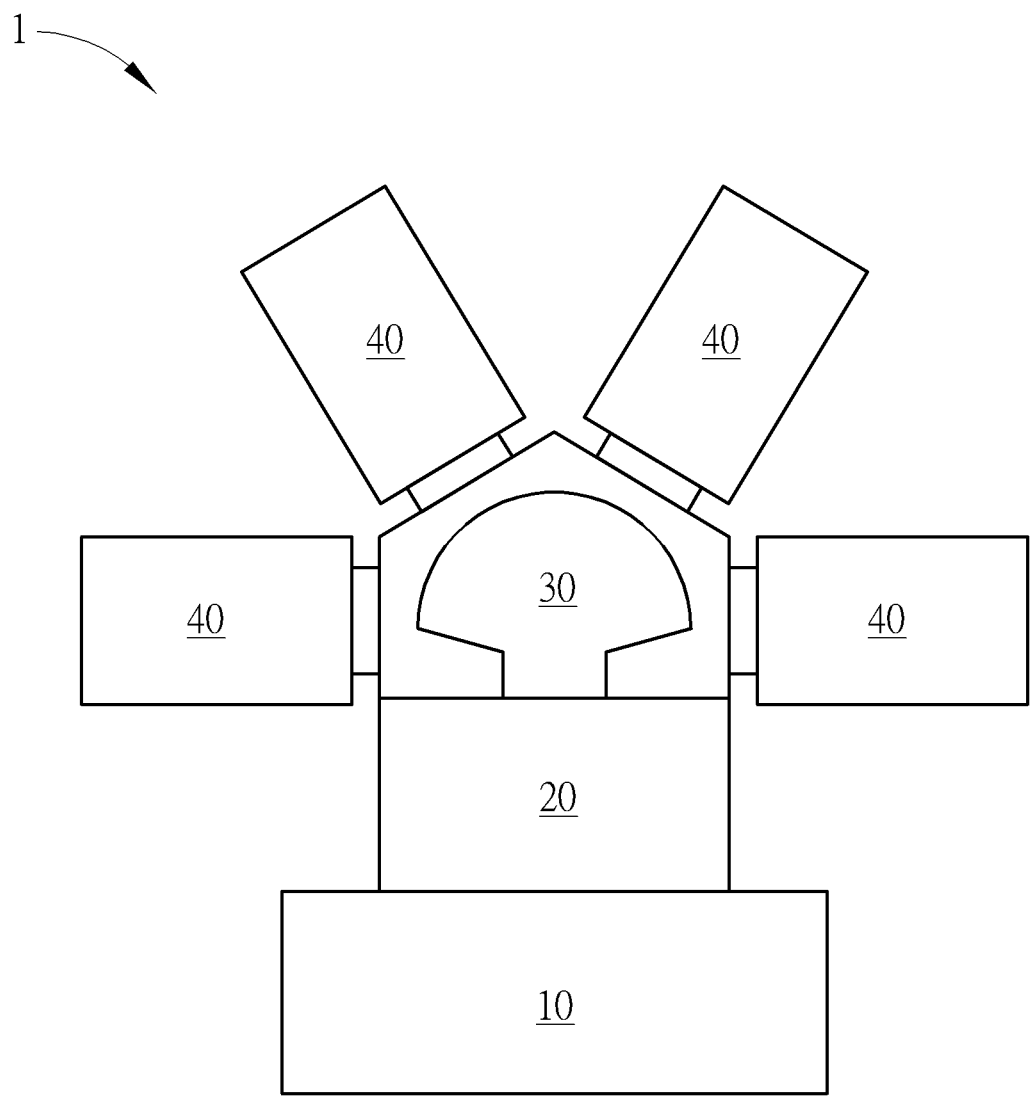
FIG. 1 shows a schematic structural diagram of a semiconductor processing machine provided by the present invention.

FIG. 1 shows a schematic structural diagram of a semiconductor processing machine provided by the present invention. As shown in FIG. 1, the semiconductor processing machine 1 of the present invention is, for example, a machine for depositing a coating film, which includes a plurality of chambers, including an atmospheric transfer chamber 10, an atmospheric/vacuum conversion chamber 20 (i.e., a load-lock chamber described later), a vacuum transfer chamber 30 and a plurality of reaction chambers 40. Generally speaking, a wafer is transferred from the atmospheric transfer chamber 10 to the atmospheric/vacuum conversion chamber 20, from the atmospheric/vacuum conversion chamber 20 to the vacuum transfer chamber 30, and then from the vacuum transfer chamber 30 to one of the reaction chambers 40 for steps such as deposition and coating. During the above-mentioned transfer process, the vacuum degree in each chamber will gradually increase (that is, it will gradually approach the vacuum state), so the vacuum degree can be gradually increased to avoid the drastic change of vacuum degree in the process and affect the quality of the process.

After the wafer is finished in the reaction chamber 40, for example, after the deposition step, it will be transported back to the atmospheric transfer chamber 10 by such as the robot arm through the above-mentioned reverse path. In other words, it is transferred from the reaction chamber 40 to the vacuum transfer chamber 30, then from the vacuum transfer chamber 30 to the atmosphere/vacuum conversion chamber 20, and then from the atmosphere/vacuum conversion chamber 20 to the atmosphere transfer chamber 10. During the above-mentioned transfer process, the vacuum degree in each chamber will gradually decrease (that is, it will gradually approach the atmospheric state), so that the drastic change of vacuum degree in the process can be avoided to affect the quality of the process.

The transmission speed between chambers will affect the efficiency of the whole process. If the time that the wafer stays in the chamber can be reduced or the transfer speed of the wafer between chambers can be increased, it will help to improve the overall productivity. The applicant found that the wafer stayed in the atmosphere/vacuum conversion chamber 20 (that is, the load-lock chamber) for a long time during the above-mentioned transfer process, mainly because the load-lock chamber 20 needed to perform the steps of vacuumizing (pumping gas out of the chamber) to improve the vacuum degree, and breaking the vacuum (inflating gas into the chamber) to reduce the vacuum degree, especially the step of breaking the vacuum would take a long time.

Figure 2:
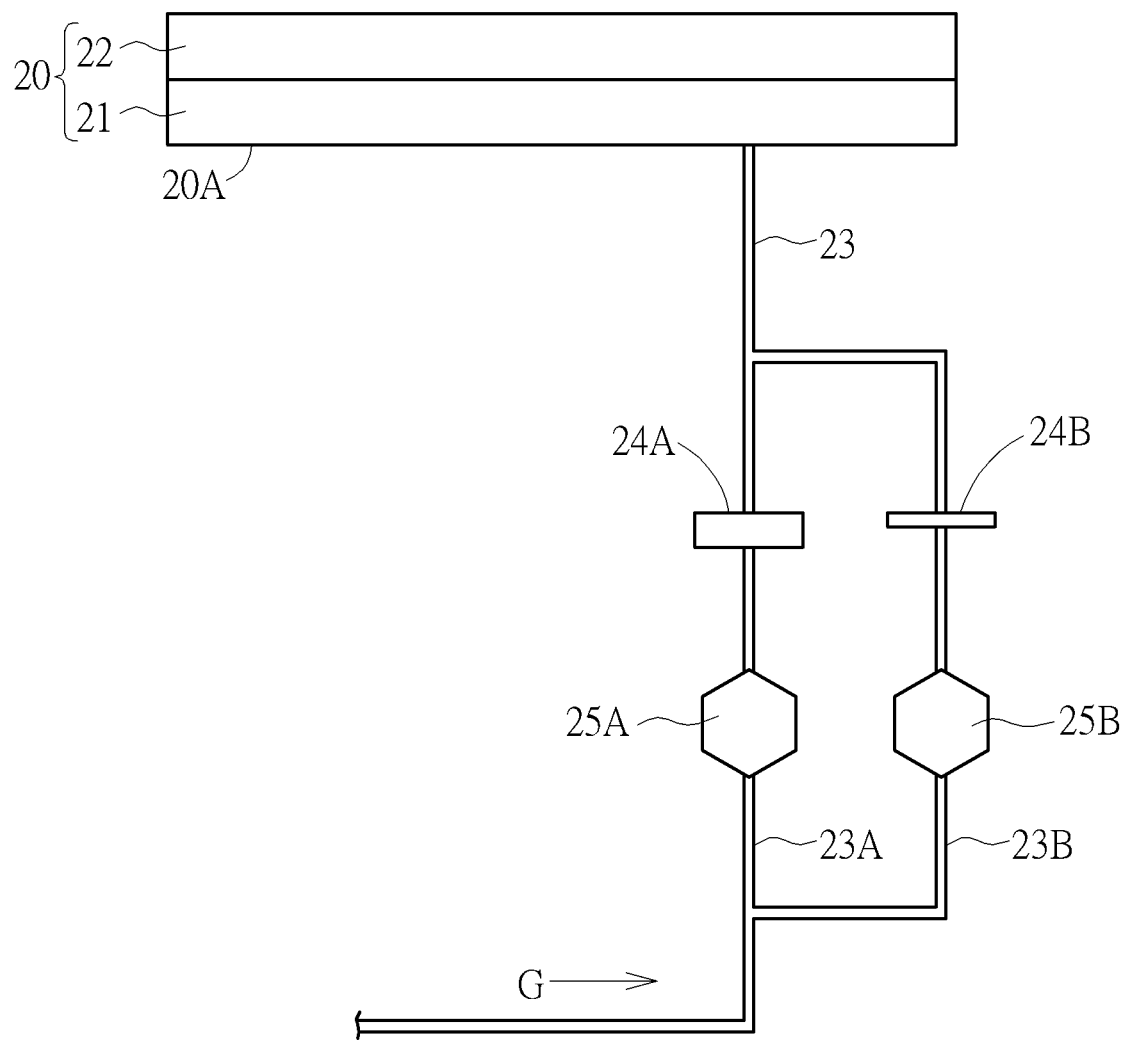
FIG. 2 is a schematic diagram showing the connection structure of a load-lock chamber and a gas pipeline according to an embodiment of the present invention.

FIG. 2 is a schematic diagram showing the connection structure of a load-lock chamber and a gas pipeline according to an embodiment of the present invention. As shown in FIG. 2, the load-lock chamber 20 includes a load-lock chamber body 21 and a top lid 22. The top lid 22 can be opened and a wafer (not shown) can be put into the load-lock chamber body 21. The load-lock chamber body 21 includes a bottom surface 20A. In addition, a gas pipeline 23 is connected to the bottom of the load-lock chamber body 21, and the gas G flows from the gas pipeline 23 to the bottom of the load-lock chamber body 21 along the arrow direction in FIG. 2. In this embodiment, the diameter of the gas pipeline 23 is, for example, ¼ inch, but it is not limited to this. The gas pipeline 23 also includes a branch pipe 23A and a branch pipe 23B, the branch pipe 23A includes a gasket 24A and a pneumatic valve 25A, and the branch pipe 23B includes a gasket 24B and a pneumatic valve 25B. Among them, the pneumatic valve 25A and the pneumatic valve 25B control the flow of gas in the pipeline through the switch, which are the control elements of a pipeline switch, while the gasket 24A and the gasket 24B have different inner diameters, and their function is to control the gas flow through the inner diameter. One end of the gas pipeline 23 is connected with a gas source for providing gas into the load-lock chamber body 21. That is to say, the gas will pass through the gas pipeline 23. After passing through the pneumatic valves 25A, 25B and the gaskets 24A, 24B, it is sent to the load-lock chamber body 21, so that the load-lock chamber 20 is vacuum-broken. In addition, the bottom of the load-lock chamber body 21 also includes another gas extraction pipeline (not shown) for extracting gas from the load-lock chamber 20, so that the load-lock chamber 20 can achieve the effect of vacuum extraction.

According to the applicant's observation, at present, the vacuumizing time of the load-lock chamber 20 is about 20 seconds, while the vacuum breaking time is about 50 seconds. Compared with the transmission between other chambers, it takes more time for the load-lock chamber to break the vacuum, that is to say, the above vacuum breaking step obviously affects the process efficiency.

However, if the applicant simply increase the gas delivery rate of the gas pipeline 23 or increase the diameter of the gas pipeline 23, although the speed of the vacuum breaking step can be improved, it is easy to cause the gas flow in the load-lock chamber 20 to be unstable. For example, some particles (such as falling dust) may be deposited at the bottom of the load-lock chamber 20, and as shown in FIG. 2, the gas pipeline 23 is connected to the bottom of the load-lock chamber body 21 of the load-lock chamber 20. Therefore, the gas is sent into the load-lock chamber 20 from below. When the gas passing through the gas pipeline 23 is large, particles at the bottom of the load-lock chamber body 21 may be blown up, and the quality of the wafer may be affected.

Figure 3:
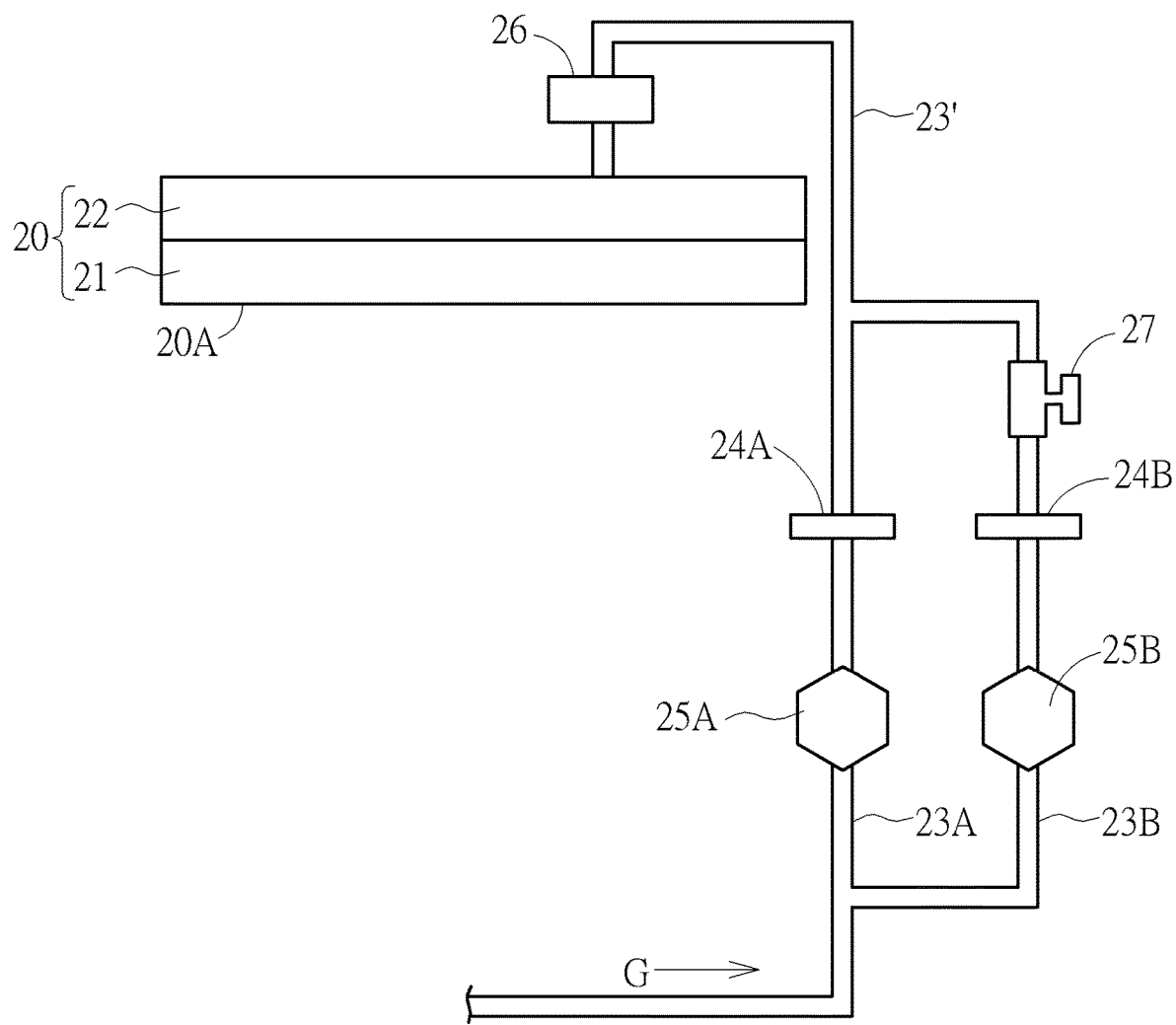
FIG. 3 provides a schematic diagram of the connection structure of an improved load-lock chamber and a gas pipeline.

In order to solve the above problems, FIG. 3 of the present invention provides a schematic diagram of the connection structure between an improved load-lock chamber and a gas pipeline. In this embodiment, the same elements are denoted by the same reference numerals. As shown in FIG. 3, the load-lock chamber 20 includes a load-lock chamber body 21 and a top lid 22, but the difference from the above embodiment is that the gas pipeline 23' is connected to the top lid 22, so the gas G in the gas pipeline 23' will be sent into the load-lock chamber 20 from above. In this way, the situation that the particles deposited on the bottom of the load-lock chamber 20 are blown up can be obviously reduced.

In this embodiment, the diameter of the gas pipeline 23' is, for example, greater than or equal to ⅜ inch, and the diameters of the gas pipeline 23' and the branch pipes 23A and 23B are the same, but it is not limited to this. The gas pipeline 23' in this embodiment has a larger pipe diameter than the gas pipeline 23 in FIG. 2. In addition, in this embodiment, a filter 26 is arranged at one end of the gas pipeline 23' near the top lid 22, and the filter 26 is used for filtering impurities or particles in the gas pipeline 23', so as to prevent the impurities or particles in the gas pipeline 23 from being blown into the load-lock chamber 20 and affecting the quality of the wafer.

In addition, in this embodiment, a pressure regulating valve 27 is also provided in the gas pipeline 23B for controlling the gas flow rate of the gas pipeline 23'. The gas flow rate can also be actively lowered in some processes that require high-precision. Besides, in the embodiment of FIG. 2, the dimensions of the gasket 24A and the gasket 24B are different, so there may be a situation that the gas cannot operate normally due to human assembly errors. In this embodiment, the gasket 24A and the gasket 24B can be designed with the same size, so as to avoid the wrong assembly.

According to the above description and drawings, the present invention provides a semiconductor processing machine, which comprises a plurality of chambers (the atmospheric transfer chamber 10, the load-lock chamber 20, the vacuum transfer chamber 30 and the reaction chamber 40), wherein at least one of the chambers is a load-lock chamber 20, and the load-lock chamber 20 comprises a bottom surface 20A, a top lid 22 opposite to the bottom surface, and a top lid 22 connected with the load-lock chamber 20 by an gas pipeline 23.

In some embodiments of the present invention, the gas pipeline 23 has a diameter greater than ⅜ inch.

In some embodiments of the present invention, a filter 26 is further included, which is connected with the gas pipeline 23 and located between the load-lock chamber 20 and the gas pipeline 23.

In some embodiments of the present invention, a pressure regulating valve 27 is further included, which is located at a middle section of the gas pipeline 23.

In some embodiments of the present invention, a high vacuum chamber (i.e., the reaction chamber 40) is further included in the plurality of chambers.

In some embodiments of the present invention, a robot arm is further included for transferring a wafer located in the load-lock chamber 20 to the high vacuum chamber (the reaction chamber 40) or for transferring a wafer in the high vacuum chamber to the load-lock chamber 20.

In some embodiments of the present invention, the load-lock chamber 20 comprises a load-lock chamber body 21 and the top lid 22, wherein the load-lock chamber body 21 and the top lid 22 can be separated from each other.

In some embodiments of the present invention, the gas pipeline 23 is connected with the top lid 22 of the load-lock chamber 20, and gas is introduced into the load-lock chamber body 21 from a top surface or a side surface of the load-lock chamber 20 through the gas pipeline 23 (as shown in FIG. 3, gas is introduced from the top surface).

In addition, the present invention provides an operation method of a semiconductor processing machine, which includes providing a plurality of chambers (the atmospheric transfer chamber 10, the load-lock chamber 20, the vacuum transfer chamber 30 and the reaction chamber 40), wherein at least one of the chambers is a load-lock chamber 20, and the load-lock chamber 20 includes a bottom surface 20A and a top lid 22 opposite to the bottom surface, and providing an gas pipeline 23 to connect the top lid 22 of the load-lock chamber 20.

In some embodiments of the present invention, the time of the vacuum breaking step is less than 25 seconds.

In some embodiments of the present invention, after the wafer in the load-lock chamber 20 is transferred to another chamber (i.e., the reaction chamber 40), a coating process is performed in the other chamber.

To sum up, the invention provides an improved semiconductor machine and an operation method thereof. In particular to an improved connection structure of a load-lock chamber and a gas pipeline. The main difference is that the joint of the pipeline is moved from the load-lock chamber body to the top lid of the load-lock chamber, elements such as filters and pressure regulating valves are added, and the gaskets are unified to the same size. According to the applicant's experimental results, after improving the connection structure between the load-lock chamber and the pipeline in the above way, the time of each vacuum breaking step can be reduced from 50 seconds to about 22 seconds, thus greatly improving the process speed. In the current process of semiconductor machine, the number of wafers produced per hour can be increased from 45 pieces to about 75 pieces, which improves the process efficiency by about 166%. In addition, because the size of the gasket is unified, the probability of error caused by manual assembly can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor processing machine, comprising:
   a plurality of chambers, wherein at least one of the chambers is a load-lock chamber, and the load-lock chamber comprises a bottom surface and a top lid opposite to the bottom surface; and
   a gas pipeline is connected with the top lid of the load-lock chamber, wherein the gas pipeline is not connected to other parts of the load-lock chamber except the top lid and the gas pipeline includes gaskets of uniform size.

2. The semiconductor processing machine according to claim 1, wherein a diameter of the gas pipeline is greater than ⅜ inch.

3. The semiconductor processing machine according to claim 1, further comprising a filter, which is connected with the gas pipeline and located between the load-lock chamber and the gas pipeline.

4. The semiconductor processing machine according to claim 1, further comprising a pressure regulating valve located at a middle section of the gas pipeline.

5. The semiconductor processing machine according to claim 1, wherein the chambers further comprise a high vacuum chamber.

6. The semiconductor processing machine according to claim 5, further comprising a robot arm for transferring a wafer located in the load-lock chamber to the high vacuum chamber or transferring a wafer in the high vacuum chamber to the load-lock chamber.

7. The semiconductor processing machine according to claim 1, wherein the load-lock chamber comprises a load-lock chamber body and the top lid, wherein the load-lock chamber body and the top lid can be separated from each other.

8. The semiconductor processing machine according to claim 7, wherein the gas pipeline is connected with the top lid of the load-lock chamber, and gas is introduced into the load-lock chamber body from a top surface or a side surface of the load-lock chamber through the gas pipeline.

9. An operation method of a semiconductor processing machine, comprising:
   providing a plurality of chambers, wherein at least one of the chambers is a load-lock chamber, and the load-lock chamber comprises a bottom surface and a top lid opposite to the bottom surface;
   providing a gas pipeline to connect the top lid of the load-lock chamber, wherein the gas pipeline is not connected to other parts of the load-lock chamber except the top lid and the gas pipeline includes gaskets of uniform size; and
   performing a vacuum breaking step on the load-lock chamber, and transferring a wafer located in the load-lock chamber to another chamber.

10. The method for operating a semiconductor processing machine according to claim 9, wherein a diameter of the gas pipeline is greater than ⅜ inch.

11. The method for operating a semiconductor processing machine according to claim 9, further comprising providing a filter, which is connected with the gas pipeline and located between the load-lock chamber and the gas pipeline.

12. The method for operating a semiconductor processing machine according to claim 9, further comprising providing a pressure regulating valve located at a middle section of the gas pipeline.

13. The method for operating a semiconductor processing machine according to claim 9, wherein the plurality of chambers further comprise a high vacuum chamber.

14. The method for operating a semiconductor processing machine according to claim 13, further comprising providing a robot arm for transferring the wafer in the load-lock chamber to the high vacuum chamber or transferring the wafer in the high vacuum chamber to the load-lock chamber.

15. The method for operating a semiconductor processing machine according to claim 9, wherein the load-lock chamber comprises a load-lock chamber body and the top lid, wherein the load-lock chamber body and the top lid can be separated from each other.

16. The operation method of the semiconductor processing machine according to claim 15, wherein the gas pipeline is connected with the top lid of the load-lock chamber, and gas is introduced into the load-lock chamber body from a top surface or a side surface of the load-lock chamber through the gas pipeline.

17. The method for operating a semiconductor processing machine according to claim 9, wherein the vacuum breaking step takes less than 25 seconds.

18. The method for operating a semiconductor processing machine according to claim 9, wherein after the wafer in the load-lock chamber is transferred to another chamber, a coating process is performed in the other chamber.

\* \* \* \* \*